United States Patent
Kiani

(10) Patent No.: US 7,034,585 B1
(45) Date of Patent: Apr. 25, 2006

(54) VDD DETECT CIRCUIT WITHOUT ADDITIONAL POWER CONSUMPTION DURING NORMAL MODE

(75) Inventor: Khusrow Kiani, Oakland, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/367,509

(22) Filed: Feb. 14, 2003

(51) Int. Cl.
*H03K 17/22* (2006.01)

(52) U.S. Cl. ...................................... 327/143
(58) Field of Classification Search ............... 327/143, 327/198
See application file for complete search history.

(56) References Cited

U.S. PATENT DOCUMENTS

| | | | |
|---|---|---|---|
| 5,455,526 A | 10/1995 | Runas | |
| 5,469,099 A * | 11/1995 | Konishi | 327/198 |
| 6,160,430 A * | 12/2000 | Drapkin et al. | 327/143 |
| 6,160,431 A * | 12/2000 | Crotty | 327/143 |
| 6,184,731 B1 * | 2/2001 | Nagaoka | 327/143 |
| 6,310,493 B1 | 10/2001 | Taniguchi | |
| 6,335,637 B1 | 1/2002 | Correale et al. | |
| 6,346,835 B1 * | 2/2002 | Ozeki et al. | 327/143 |
| 6,407,598 B1 * | 6/2002 | Ogane | 327/143 |
| 6,492,850 B1 * | 12/2002 | Kato et al. | 327/143 |
| 6,853,221 B1 * | 2/2005 | Wert | 327/143 |

* cited by examiner

*Primary Examiner*—Terry D. Cunningham
(74) *Attorney, Agent, or Firm*—Jurgen Vollrath

(57) ABSTRACT

In a VDD detect circuit, the output driver interfaces are disabled during power up by pulling the gates of the PMOS interface transistors high using a additional circuitry that operates when VDD is not asserted. The circuit includes a level shifter for controlling the PMOS and NMOS interface transistors during normal mode, and the additional circuitry includes an inverter and a diode string powered by VDDIO, that provides a reference voltage to the level shifter during power up mode. Current flow through the diode string is disabled by a PMOS transistor controlled by VDD, and current flow through the inverter is disabled by the PMOS transistor of the inverter, which is also controlled by VDD. Thus, the additional circuitry provides the enable signal during power up when VDD is not asserted, and does so without causing additional power consumption during normal mode, since the PMOS transistors prevent additional current flow when VDD is high.

13 Claims, 2 Drawing Sheets

VDD DETECT CIRCUIT WITHOUT ADDITIONAL POWER CONSUMPTION DURING NORMAL MODE

FIELD OF THE INVENTION

The invention relates to a VDD detection circuit for detecting the core supply during the chip interface I/O cells VDDIO power up. In particular it relates to a circuit that disables output driver interfaces during power up mode.

BACKGROUND OF THE INVENTION

In digital and mixed signal (digital and analog) circuits two power supplies are commonly used. The core or digital portion of the circuit with its thin gate oxide transistors is typically supplied by a low voltage supply referred to as VDD, which has a voltage level dependent on the process used. On the other hand, the I/O interface makes use of a higher voltage level which is a standardized voltage level (3.3V). Accordingly the I/O interface makes use of thick gate oxide transistors to accommodate the higher voltage level.

An essential part of an I/O interface is a core supply detection circuit for sensing the core supply voltage (VDD) during power up when only VDDIO is asserted. During this power up period the input interfaces to the core are set. However, it is important that the output driver interfaces remain disabled during this period to avoid high current flow through the output drivers. This can best be understood by reference to FIG. 1, which shows a typical output interface with its PMOS transistor 100 and its NMOS transistor 110. The gate of PMOS transistor 100 is controlled by a NAND gate 112 with its level-shifted inputs supplied by the core logic, and having VDDIO as power supply. The gate of NMOS transistor 110 is controlled by a NOR gate 114 with its level-shifted inputs supplied by the core logic, and having VDDIO as power supply. Thus, when VDD is disabled during power up, both gates of the transistors 100, 110 are asserted, which switches on both the NMOS transistor 110 as well as the PMOS transistor 100. This allows large current to flow through the driver transistors. Thus, the output should somehow be disabled. However, the enable signal that is typically used for enabling or disabling the output interface during normal mode of operation, is driven by the core. Thus, during power up, when there is no VDD core supply, there can also be no enable signal. Also, the level shifter, which brings the voltage level from VDD to VDDIO, will not work since with no VDD supply, both inputs of the level shifter are at ground. Thus the level shifter will not switch. Thus an independent solution has to be found for switching off the output interface during the power up mode.

One solution is described in concurrently filed application of the same applicant entitled "VDD DETECT CIRCUIT KEEPING OUTPUT DRIVERS DISABLED DURING POWER UP". However, one drawback of that circuit is the fact that power is consumed by the circuit during normal mode of operation, when the circuit is enabled. The present invention seeks to address this issue by providing a VDD detect circuit that disables output driver interfaces while not consuming power during normal mode of operation.

SUMMARY OF THE INVENTION

The present invention provides a method and structure for detecting the core supply, VDD and disabling the output drivers when VDD is not asserted, and avoiding additional power consumption during normal mode of operation.

According to the invention, there is provided a VDD detect circuit for disabling an output interface during power up, comprising a VDD to VDDIO level shifter, means for disabling the PMOS and NMOS transistors of the output driver interface, and a current shut off to deactivate the means for disabling when VDD is active.

Typically, the means for disabling includes a voltage reference created from VDDIO that is activated when VDD is inactive. The means may also include a current shut off to deactivate the voltage reference when VDD is active. Further, according to the invention, there is provided a VDD detect circuit for detecting VDD during power up, comprising a level shifter for shifting an enable signal that enables or disables the PMOS and NMOS transistors of at least one output interface during normal mode, and a pull-up circuit for disabling the PMOS and NMOS transistors of the at least one output interface during power up mode, wherein the pull-up circuit includes means for preventing current flow through the pull-up circuit during normal mode of operation. In one embodiment, the pull-up circuit includes a voltage reference circuit powered by VDDIO and activated when VDD is inactive. The voltage reference circuit may include a diode string and an inverter comprising a PMOS and a NMOS controlled by VDD, wherein the source of the PMOS of the inverter is connected to a reference voltage from the diode string. The means for preventing current flow may include the PMOS transistor of the inverter, which is controlled by VDD and prevents current flow through the inverter, and a second PMOS transistor connected to the diode string of the pull-up circuit and controlled by VDD to prevent current flow through the diode string. Typically the level shifter shifts the enable signal from VDD to VDDIO. The level shifter may comprise a first pair of serially connected PMOS and NMOS transistors defining the level shift up of the input signal (and hereafter referred to as a first node) between them, and a second pair of PMOS and NMOS transistors defining a the level shift up of the inverse input signal (and hereafter referred to as a second node) between them, the nodes and gates of the PMOS transistors being cross-coupled. The voltage reference circuit may be connected to one of the nodes to control the voltage of said node during power up mode.

The circuit may further comprise a NAND and NOR gate powered by VDDIO and having a first input comprising the level shifted enable signal, and a second input, in the form of a level shifted data signal. The pull-up circuit may be connected to the first input of the NAND gate, typically by being connected to a node of the level shifter.

Still further, according to the invention, there is provided a method of disabling an output interface that includes PMOS and NMOS driver output transistors, during power up, comprising providing a controlling a NAND and a NOR gate supplied by VDDIO, wherein the output of the NAND gate feeds the gate of the PMOS driver transistor and the NOR gate feeds the gate of the NMOS driver transistor, and pulling an input to the NAND gate low, and an input to the NOR gate high during power up by providing a low signal using pull-up circuitry when VDD is disabled, and preventing current flow through the pull-up circuitry during normal mode. The NMOS driver transistor may also be disabled by means of a signal from a NOR gate that is supplied by VDDIO. The method further includes providing a level shifter for shifting the voltage level of the signal on the input to the NAND gate and the input to the NOR gate, which may be an enable signal. The level shifter may be controlled by an external reference voltage during power up. In one embodiment, the external reference voltage is obtained by passing VDDIO through a diode string.

DETAILED DESCRIPTION OF THE INVENTION

Figure 1:
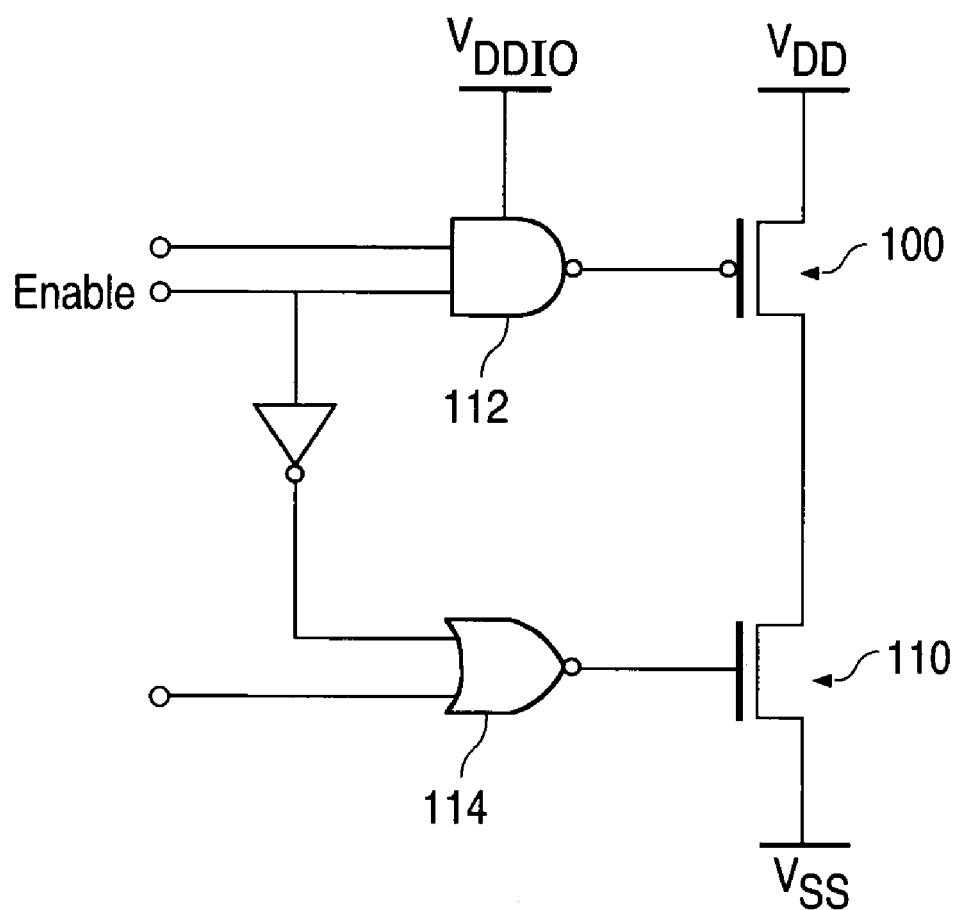
FIG. 1 is a schematic circuit diagram of a typical output driver.
Figure 2:
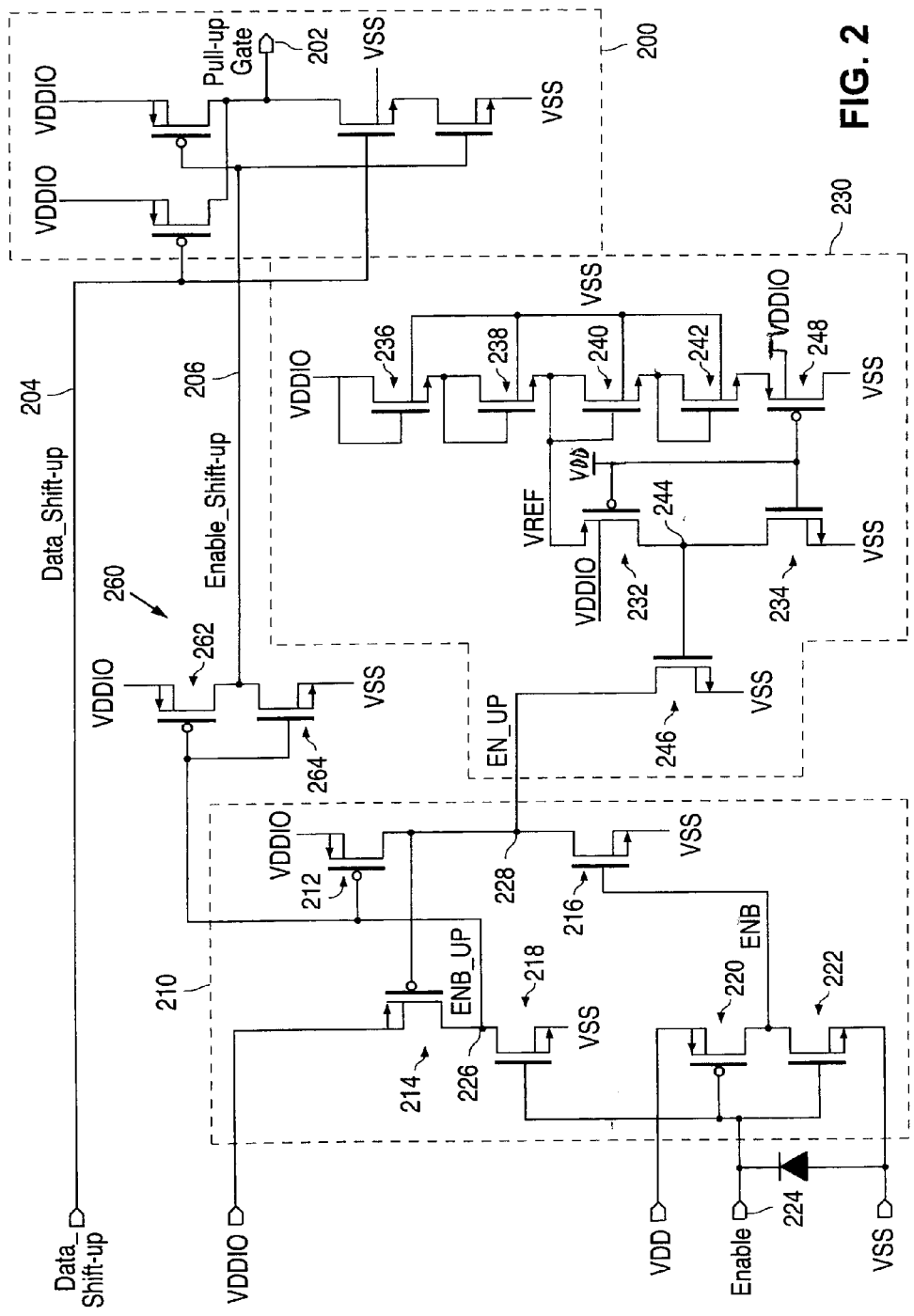
FIG. 2 is a schematic circuit diagram of one embodiment of the invention.

From the discussion above, it will be appreciated that the PMOS transistors of the output driver interfaces, such as PMOS 100 in FIG. 1, should be switched off during power up to avoid large current flow through the output interface. Preferably, the NMOS transistor 110 should also be switched off during power-up mode. The present invention achieves this by pulling up the gates of the PMOS driver transistors and pulling down the gates of the NMOS driver transistors of the output driver interfaces during power up, thereby disabling the output driver interfaces. FIG. 2 shows one embodiment of the present invention, which includes a NAND gate 200 that is supplied by VDDIO and remains active during power up. (The NAND gate will be described further below.) The circuit further includes a level shifter 210 for shifting the level of the Enable signal 224 from VDD to VDDIO. (Again, the level shifter will be discussed further below). In order to accommodate the situation where VDD is inactive during power up mode, the present circuit includes additional circuitry, indicated generally by reference numeral 230. For ease of reference, the additional circuitry 230 will be referred to as a pull-up circuit since it generates a low signal that is used by the level shifter 210 to define one of the nodes (node 228) as low and is subsequently used by the NAND gate to pull-up the gates of the PMOS transistors of the output driver interfaces, as is discussed further below. Similarly the NMOS transistors of the output driver interfaces will be disabled through a NOR gate (not shown).

The NAND gate 200 is a standard NAND which provides a low output 202 when both data input 204, and enable input 206 are high, and has a high output 202 when either one or both inputs are low. Thus by controlling Enable_Shift-up (input 206) to go low during power up, PMOS transistors of the output driver interfaces will be disabled. Similarly the NMOS transistors of the output driver interfaces will be disabled through a NOR gate (not shown).

The level shifter 210 is a standard level shifter comprising two PMOS transistors 212, 214, and two NMOS transistors 216, 218. PMOS 212 and NMOS 216 are connected serially to define a node 228 between them, and PMOS 214 and NMOS 218 are connected serially to define a node 226 between them. The nodes 226, 228 are cross coupled to the gates of the PMOS transistors 212, 214, respectively, as shown. The shifter 210 further includes an inverter stage comprising a PMOS transistor 220 and a NMOS transistor 222. In order to shift the voltage level of the Enable signal 224 from VDD to VDDIO level, the Enable signal 224 is fed into the gate of NMOS 218, and the inverted Enable signal from the inverter is fed into the gate of NMOS 216.

Thus, during normal mode of operation (both VDDIO and VDD asserted), the voltages on the nodes 226, 228 are defined and the level shifter controls the Enable_Shift-up input 206 of the NAND gate 200, and thus the output of the NAND gate, depending on the nature of the Enable signal 224. When the Enable signal 224 is high it turns NMOS 218 on and pulls node 226 down to VSS. This turns on PMOS 212. Also, the inverted Enable signal (ENB) turns off NMOS 216. Thus node 228 is pulled up to VDDIO, which also serves to turn off PMOS 214 to ensure that node 226 is low. Node 226 also forms the output to the level shifter 210 to provide the signal on the Enable_Shift-up input 206 via inverter 260 (which consists of a PMOS transistor 262 and a NMOS transistor 264). Thus, during normal mode, with Enable high, the output of the level shifter (EN_UP) is high (and ENB_UP is low) which enables both the PMOS and NMOS transistors of the output driver interfaces.

During normal mode with the Enable signal 224 low, NMOS 218 turns off and NMOS 216 turns on. Thus node 226 goes high and node 228 is pulled down to VSS. Therefore PMOS 214 turns on and PMOS 212 turns off to ensure that the node 226 is at VDDIO and the node 228 is at VSS. Thus the node 226 is at VDDIO, thereby providing a low signal on the Enable_Shift-up input 206 to the NAND gate 200 (due to the inverter 260). This ensures a high output on output 202, thereby allowing subsequent PMOS transistors of output driver interfaces to be turned off. Similarly the NMOS transistors of the output driver interfaces will be disabled through a NOR gate (not shown).

During power up mode, with VDD not asserted (and consequently also Enable 224 disabled, since it is dependent on VDD), both the input and the output from the inverter defined by transistors 220, 222, are low, thus preventing the level shifter 210 from working properly, since the voltages on the nodes 226, 228 of the level shifter are not defined. In order to solve this problem, the present embodiment provides additional circuitry 230 to define the voltages on the nodes 226, 228. This allows the output drivers to be disabled even when VDD is not asserted.

The circuitry 230 includes an inverter comprising a PMOS transistor 232 and an NMOS transistor 234, and diode chain or string consisting of NMOS transistors 236, 238, 240, 242. It will be appreciated that the pull-up circuitry 230 includes two potential current paths: one through the inverter and one through the diode string. The diode string is terminated by a PMOS transistor 248, which provides a current path through the diode string, thereby defining a clear reference voltage. This PMOS transistor 248, however also serves to prevent current flow through the diode string during normal mode by having its gate controlled by VDD, and ensuring that any current that would want to flow through the diode string would cause enough of a voltage drop across the diodes to ensure that the PMOS transistor is switched off. Thus, this forms a self-sustaining circuit. In order to avoid current through the inverter during normal operation, the source of the PMOS 232 is connected to a voltage that is low enough to ensure that PMOS 232 is disabled when VDD is high. Again, the circuit is self-sustaining, since any current that would want to flow through the PMOS transistor 232 would cause sufficient voltage drop over the diode connected NMOS transistors that it flows through that PMOS transistor 232 would be switched off. In the present embodiment, the use of a diode string to define the reference voltage allows the circuit to accommodate different processes with their different VDD voltage levels, by simply tapping off the appropriate location in the diode chain. In the present embodiment the reference voltage VREF is derived from the source of NMOS 238.

During power up mode, when VDD is not asserted, PMOS 232 will be on and NMOS 234 will be off causing node 244 (VC) to go to VREF. This turns on NMOS transistor 246 to pull node 228 down to VSS. This, in turn, turns on PMOS 214 of the level shifter 210, thereby pulling up the node 226 to VDDIO and turning off PMOS 212. The high voltage level at node 226 is inverted by inverter 260 to cause Enable_Shift-up to go low. This is then used to disable PMOS and NMOS transistors of output driver interfaces (not shown).

As discussed above, during normal mode, when VDD is asserted, no current flows through the inverter since any current that would flow would turn off PMOS 232 since VREF is chosen to be low enough to ensure that PMOS 232 switches off with VDD on its gate. NMOS 234 turns on to pull node 244 down to VSS and thus turn off NMOS 246. Also, as mentioned above, the diode chain has no current flow since PMOS transistor 248 whose gate is controlled by VDD, would switch off if there were any current flow. It will be appreciated that PMOS 248 is included to ensure that current flows through the diode chain during power up, thereby providing a clear voltage reference VREF. On the other hand, there should be no current flow through the diode chain during normal mode of operation. If VREF is Vtp below VDD, it will shut off PMOS 232 and also PMOS 248 (since the source of PMOS 248 lies two diode drops below PMOS 232). If VREF were to be Vtp above VDD it would switch off NMOS transistors 236, 238, thus, again preventing current flow through the diode chain 236, 238, 240, 242. Thus the circuit is self controlling. It will be appreciated that from a logic point of view, the inverter 260 does not perform any function. It has been included in this embodiment, however, to compensate for the slow rise time of the level shifter 210. In order to allow the circuit of the present embodiment to operate for all currently available processes, NMOS transistors 216, 218 have to be made approximately three times larger than PMOS transistors 212, 214 to allow it to turn on even under extreme conditions where VDD is only 0.9 V (the lower range of 1V±10% for 0.1 μm technology) and VDDIO is 3.6V. With the need to make the NMOS larger, comes a slow signal rise time and a fast fall time. The inverter 260 serves to even out the rise and fall times.

It will be appreciated that the pull-up circuit 230 can be used to control more than one output driver interface. While the present invention has been described with reference to one specific embodiment, it will be appreciated that variations to the circuit can be provided without departing from the scope of the invention. Thus, other circuit layouts could be devised for disabling output driver interfaces when VDD is not enabled, without departing from the scope of the invention.

What is claimed is:

1. In a circuit having an I/O power supply, VDDIO, and making use of low voltage, VDD, for core regions, a VDD detect circuit for disabling at least one output driver interface during power up in which VDDIO is asserted but VDD is not yet asserted, comprises
    means for disabling PMOS and NMOS transistors of the output driver interface while VDD is not asserted, wherein the means for disabling includes
        a current shut off to prevent current flow through the means for disabling, when VDD is asserted, wherein the current shut off allows different VDD levels to be accommodated;
        a voltage reference created from VDDIO, which is activated while VDD is not asserted; and a diode string to provide the voltage reference.

2. A circuit of claim 1, wherein the means for disabling further includes an inverter comprising a PMOS and a NMOS transistor controlled by VDD.

3. A circuit of claim 2, wherein the current shut off includes at least the PMOS transistor of the inverter.

4. A circuit of claim 3, wherein the current shut off further includes a PMOS transistor terminating the diode string and controlled by VDD.

5. In a circuit having an I/O power supply, VDDIO, and making use of low voltage, VDD, for core regions, a VDD detect circuit for detecting VDD during power up in which VDDIO is asserted but VDD is not yet asserted, comprises
    a level shifter for shifting an enable signal that enables or disables PMOS and NMOS transistors of at least one output interface during normal mode,
    a pull-up circuit for disabling the PMOS and NMOS transistor of the at least one output driver interface during power up mode, wherein the pull-up circuit includes means for switching off current flow through the pull-up circuit during normal mode, wherein the means for switching off current flow allows different VDD levels to be accommodated
    wherein the pull-up circuit includes a voltage reference circuit powered by VDDIO and activated when VDD is not asserted; and
    wherein the voltage reference circuit includes a diode string.

6. A circuit of claim 5, wherein the level shifter comprises a first pair of serially connected PMOS and NMOS transistors defining a first node between them, and a second pair of PMOS and NMOS transistors defining a second node between them, the nodes and gates of the PMOS transistors being cross-coupled.

7. A circuit of claim 6, wherein the pull-up circuit is connected to a node of the level shifter.

8. A circuit of claim 7, wherein the voltage reference circuit includes an inverter comprising a PMOS and a NMOS transistor controlled by VDD, wherein the source of the PMOS transistor of the inverter is connected to a reference voltage from the diode string.

9. A circuit of claim 7, wherein the diode string is terminated by a PMOS transistor controlled by VDD.

10. A circuit of claim 9, wherein the means for switching off current flow through the pull-up circuit includes the PMOS transistor of the inverter.

11. A circuit of claim 10, wherein the means for switching off current flow through the pull-up circuit further includes the PMOS transistor terminating the diode string.

12. A circuit of claim 5, wherein the level shifter shifts the enable signal from VDD to VDDIO.

13. A circuit of claim 5, wherein the pull-up circuit disables a plurality of output driver interfaces during power up mode.

* * * * *